(12) United States Patent
Taniguchi et al.

(10) Patent No.: US 8,093,962 B2
(45) Date of Patent: Jan. 10, 2012

(54) FILTER, DUPLEXER AND COMMUNICATION APPARATUS

(75) Inventors: Shinji Taniguchi, Kawasaki (JP); Tokihiro Nishihara, Kawasaki (JP); Tsuyoshi Yokoyama, Kawasaki (JP); Masafumi Iwaki, Kawasaki (JP); Motoaki Hara, Kawasaki (JP); Takeshi Sakashita, Kawasaki (JP); Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 272 days.

(21) Appl. No.: 12/494,990

(22) Filed: Jun. 30, 2009

(65) Prior Publication Data
US 2010/0060384 A1 Mar. 11, 2010

(30) Foreign Application Priority Data
Sep. 9, 2008 (JP) .................. 2008-231255

(51) Int. Cl.
*H03H 9/70* (2006.01)
*H03H 9/54* (2006.01)
(52) U.S. Cl. .......... 333/133; 333/189; 310/365
(58) Field of Classification Search ......... 333/133, 333/187–192; 310/365, 366
See application file for complete search history.

(56) References Cited

U.S. PATENT DOCUMENTS

| | | | |
|---|---|---|---|
| 6,215,375 B1 | 4/2001 | Larson, III et al. | |
| 6,693,500 B2 | 2/2004 | Yang et al. | |
| 7,116,040 B2* | 10/2006 | Inoue | 310/366 |
| 7,161,447 B2* | 1/2007 | Nomura et al. | 333/187 |
| 7,211,931 B2 | 5/2007 | Nishihara et al. | |
| 7,388,318 B2* | 6/2008 | Yamada et al. | 310/324 |
| 7,629,865 B2* | 12/2009 | Ruby | 333/189 |
| 2002/0196103 A1 | 12/2002 | Yang et al. | |
| 2005/0099094 A1 | 5/2005 | Nishihara et al. | |

FOREIGN PATENT DOCUMENTS

| | | |
|---|---|---|
| EP | 1 041 717 A2 | 10/2000 |
| JP | 2000-332568 A | 11/2000 |
| JP | 2005-124107 A | 5/2005 |
| KR | 2003-0000401 A | 1/2003 |

OTHER PUBLICATIONS

David Feld et al, "Low insertion loss, high rejection handset duplexer for UMTS-1 (WCDMA) band", 2005 IEEE Ultrasonics Symposium, p. 101-104.

* cited by examiner

*Primary Examiner* — Barbara Summons
(74) *Attorney, Agent, or Firm* — Chen Yoshimura LLP

(57) ABSTRACT

A filter has a plurality of piezoelectric thin film resonators formed by sandwiching a piezoelectric film with a lower electrode disposed on a substrate and an upper electrode. Each of the piezoelectric thin film resonators has an electrode region formed with the upper electrode and the lower electrode overlapping each other, whose outline includes a curve. Among the plural piezoelectric thin film resonators, the piezoelectric thin film resonators in the opposing electrode regions of the adjacent piezoelectric thin film resonators are shaped to have outlines complementary to each other. With the filter, influences caused by transverse mode undesired wave of the piezoelectric thin film resonators can be suppressed. Therefore, miniaturization can be achieved without sacrificing the mechanical strength of electrodes having hollow structures.

8 Claims, 15 Drawing Sheets

Low ▭▭▭▭ High

Low ▭▭▭▭ High

FILTER, DUPLEXER AND COMMUNICATION APPARATUS

CROSS-REFERENCE TO RELATED APPLICATION

This application is based upon and claims the benefit of priority of the prior Japanese Patent Application No. 2008-231255 filed on Sep. 9, 2008, the entire contents of which is incorporated herein by reference.

FIELD

The disclosure of the present application relates to a filter. The disclosure of the present application relates to a duplexer having a filter. The disclosure of the present application relates to a communication apparatus having either a filter or a duplexer.

BACKGROUND

Due to the rapidly widespread use of wireless equipment represented by mobile phones, demand for a filter prepared by combining a plurality of small and light-weight resonators increases. Conventionally, such wireless equipment was loaded mainly with a dielectric filter or a surface acoustic waves (SAW) filter. Recently however, filters including piezoelectric thin film resonators are loaded in many cases. The piezoelectric thin film resonator is low-loss in a high frequency region and at the same time advantageous from the viewpoint of the high power capability, electrostatic discharge (ESD) characteristic and the like. Further, by using the piezoelectric thin film resonator, a smaller monolithic filter can be provided.

Such piezoelectric thin film resonators include a FBAR (Film Bulk Acoustic Resonator) type and a SMR (Solidly Mounted Resonator) type. FIGS. 1-3 are cross-sectional views showing FBARs. Each of the FBARs is prepared by laminating on a substrate a laminate film mainly including an upper electrode, a piezoelectric film and a lower electrode. In each of the FBARs, a gap is formed below the lower electrode in a region where the upper electrode and the lower electrode oppose each other. The FBARs shown in FIGS. 1-3 are different from each other in the structures of the gaps.

The FBAR as shown in FIG. 1 includes a substrate 21, a lower electrode 22, a piezoelectric film 23, an upper electrode 24, and a dielectric film 25. The substrate 21 has a through hole 26 formed from the surface to the back face.

The FBAR as shown in FIG. 2 includes a substrate 41, a lower electrode 42, a piezoelectric film 43, an upper electrode 44 and a dielectric film 45. The substrate 41 has a cavity 46 formed on the surface.

The FBAR as shown in FIG. 3 has a substrate 31, a lower electrode 32, a piezoelectric film 33, an upper electrode 34 and a dielectric film 35. The FBAR is formed on the surface of the substrate 31.

FIG. 4 is a cross-sectional view showing a SMR. The SMR includes a substrate 51, a lower electrode 52, a piezoelectric film 53, an upper electrode 54 and an acoustic reflection film 56. The acoustic reflection film 56 is disposed under the lower electrode 52. The acoustic reflection film 56 is prepared by laminating alternately a film with low acoustic impedance and a film with high acoustic impedance. The film with low acoustic impedance and the film with high acoustic impedance each has a thickness of $\lambda/4$. Here, $\lambda$ denotes a wavelength of an acoustic wave.

In the piezoelectric thin film resonator, when a high frequency electric signal is applied to the space between the upper electrode and the lower electrode, an acoustic wave is excited due to the inverse piezoelectric effect in the interior of the piezoelectric film sandwiched by the upper electrode and the lower electrode. Further, in the piezoelectric thin film resonator, a strain caused by the acoustic wave is converted to an electric signal due to the piezoelectric effect. In the FBAR, the acoustic wave is reflected on a face of the upper electrode being in contact with the air and on a face of the lower electrode being in contact with the air. In the SMR, the acoustic wave is reflected on a face of the upper electrode being in contact with air and on a face of the lower electrode being in contact with the acoustic reflection film. As a result, in the FBAR and SMR, thickness longitudinal acoustic waves having main displacement in the thickness direction occur. In the FBAR and SMR having the above-mentioned structures, a resonance occurs at a frequency where the total film thickness H of the laminate film part mainly formed with the upper electrode, the piezoelectric film and the lower electrode is the integral multiple (×n) of the ½ wavelength of the acoustic wave. The resonant frequency F can be calculated by substituting the film thickness H of the laminate film, a propagation velocity V of the acoustic wave depending on the materials, and the multiple n of the ½ wavelength of the acoustic wave, in the numerical formula below:

$$F=nV/2H.$$

This resonance phenomenon can be used to adjust the resonant frequency depending on the film thickness, thereby manufacturing a piezoelectric thin film resonator having a predetermined frequency characteristic. Further, a plurality of piezoelectric thin film resonators different from each other in the resonant frequency can be connected to manufacture a filter.

Cost reduction has been an object for a filter using a piezoelectric thin film resonator. In addition, with the trend for miniaturization of equipment loaded with a filter, smaller filters have been required. For meeting such requirements, reduction of a chip area without sacrificing the filter characteristics is considered seriously. In view of further miniaturization (reduction of area) of a chip with a filter element disposed, improvement in the arrangement of piezoelectric thin film resonators included in a filter will be required as well.

Document 1 (Proc. IEEE Ultrasonics Symposium, 2005, p. 101-104) discloses an arrangement and a structure of a piezoelectric thin film resonator included in a filter. In Document 1, in a piezoelectric thin film resonator included in a filter, the shape of a part where an upper electrode and a lower electrode sandwiching a piezoelectric film overlap (hereinafter referred briefly as an electrode shape) is a non-square and irregular polygon having no pairs of sides parallel to each other. This is for preventing occurrence of a transverse mode undesired wave in addition to the thickness longitudinal acoustic wave mainly utilized as mentioned above. The transverse mode undesired wave propagates in parallel to the electrode face, and is reflected on the electrode or the end of the gap. An undesired spurious may occur in the impedance characteristic of the piezoelectric thin film resonator as a result of exciting the transverse mode undesired wave. In a filter including a plurality of the piezoelectric thin film resonators, a ripple may occur in the passband.

Document 2 (JP 2000-332568 A) discloses a piezoelectric thin film resonator having an electrode shaped as a non-square and irregular polygon. The piezoelectric thin film resonator as disclosed in Document 2 can suppress harmful effects caused by the transverse mode undesired wave.

SUMMARY OF THE INVENTION

A filter disclosed in the present application includes a plurality of piezoelectric thin film resonators. The piezoelectric thin film resonators each includes: a substrate; a lower electrode disposed on the substrate; a piezoelectric film disposed on the substrate and on the lower electrode; and an upper electrode disposed on the piezoelectric film so as to have a part opposing the lower electrode. An electrode region where the upper electrode and the lower electrode overlap each other is shaped to have at least one pair of opposing perimeters that are unparallel to each other. Any one of the pair of perimeters opposes an electrode region of an adjacent piezoelectric thin film resonator. Spacing between the perimeter and the opposing perimeter of the electrode region of the adjacent piezoelectric thin film resonator is constant.

A duplexer disclosed in the present application includes a transmission filter and a reception filter. The transmission filter and/or reception filter include a plurality of piezoelectric thin film resonators. The piezoelectric thin film resonators each includes: a substrate; a lower electrode disposed on the substrate; a piezoelectric film disposed on the substrate and on the lower electrode; and an upper electrode disposed on the piezoelectric film so as to have a part opposing the lower electrode. An electrode region where the upper electrode and the lower electrode overlap each other is shaped to have at least one pair of opposing perimeters that are unparallel to each other. Any one of the pair of perimeters opposes an electrode region of an adjacent piezoelectric thin film resonator. Spacing between the perimeter and the opposing perimeter of the electrode region of the adjacent piezoelectric thin film resonator is constant.

A communication apparatus disclosed in the present application includes a transmission filter and a reception filter. The transmission filter and/or reception filter include a plurality of piezoelectric thin film resonators. The piezoelectric thin film resonators each includes: a substrate; a lower electrode disposed on the substrate; a piezoelectric film disposed on the substrate and on the lower electrode; and an upper electrode disposed on the piezoelectric film so as to have a part opposing the lower electrode. An electrode region where the upper electrode and the lower electrode overlap each other is shaped to have at least one pair of opposing perimeters that are unparallel to each other. Any one of the pair of perimeters opposes an electrode region of an adjacent piezoelectric thin film resonator. Spacing between the perimeter and the opposing perimeter of the electrode region of the adjacent piezoelectric thin film resonator is constant.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENT(S)

In a filter having the plural piezoelectric thin film resonators, it is preferable that opposing electrode regions of the adjacent piezoelectric thin film resonators have outlines shaped to be complementary to each other.

It is preferable in the filter that the perimeters of the electrode regions are formed to include curves Accordingly, the mechanical strength of the piezoelectric thin film resonators can be improved.

It is preferable in the filter that the electrode regions are formed to be substantially linear symmetric. Accordingly, the mechanical strength of the piezoelectric thin film resonators can be improved.

Embodiments

[1. First Configuration of Piezoelectric Thin Film Resonator]

Figure 5:
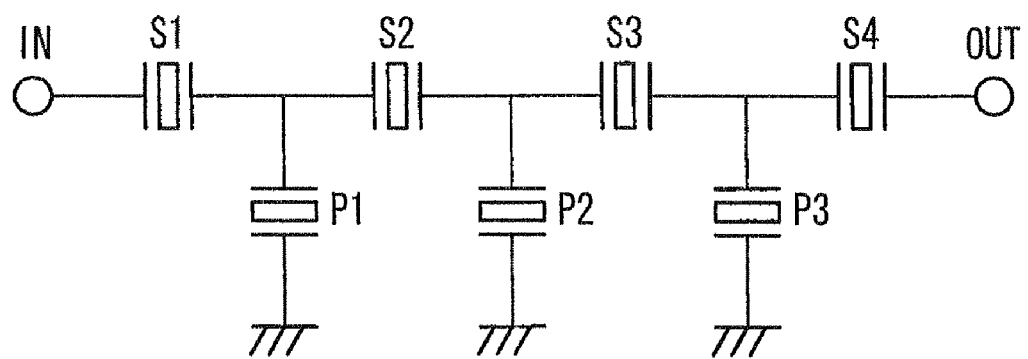
FIG. 5 is a circuit diagram of a ladder-type filter having a piezoelectric thin film resonator according to an embodiment of the present invention.

FIG. 5 is a circuit diagram showing a filter having piezoelectric thin film resonators according to the present embodiment. The filter as shown in FIG. 5 includes a plurality of piezoelectric thin film resonators. The piezoelectric thin film resonators consist of serial resonators S1-S4 and parallel resonators P1-P3. The serial resonators S1-S4 are connected to a serial arm. The parallel resonators P1-P3 are connected to parallel arms. The serial arm is connected between an input terminal IN and an output terminal OUT. The parallel arms are connected between the serial arm and the ground. The filter as shown in FIG. 5 is a bandpass filter having a predetermined passband. The filter as shown in FIG. 5 is called "ladder-type filter" since usually it is prepared by connecting piezoelectric resonators in a ladder shape.

In the filter as shown in FIG. 5, when a RF signal including various frequency components is inputted into the input terminal IN, a signal having a predetermined frequency component can be outputted from the output terminal OUT. The number of the piezoelectric thin film resonators connected to the serial arm and the parallel arms can be modified appropriately in accordance with the filter design.

The parallel resonators P1-P3 are made by providing on the film of the upper electrode a frequency adjusting film made of titanium (Ti) or the like. The resonant frequency of the serial resonators S1-S4 is higher than the resonant frequency of the parallel resonators P1-P3.

Figure 6:
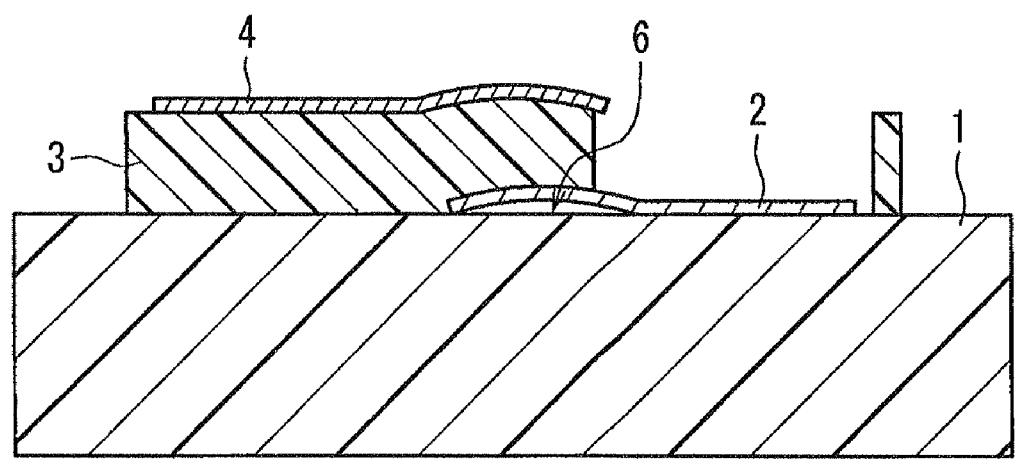
FIG. 6 is a cross-sectional view of a piezoelectric thin film resonator.

FIG. 6 is a cross-sectional view showing one of the piezoelectric thin film resonators employed as the serial resonators S1-S4 in FIG. 5. A substrate 1 is a silicon (Si) substrate having a flat main surface. A lower electrode 2 is formed of a ruthenium (Ru) film having a film thickness of 260 nm. A piezoelectric film 3 is formed of an aluminum nitride (AlN) film having a thickness of 1200 nm. An upper electrode 4 is formed of a ruthenium (Ru) film having a film thickness of 260 nm.

The Si substrate used for the substrate 1 can be replaced by a quartz substrate or the like. The substrate 1 can be a substrate that resists to formation of a through hole. The substrate 1 can include silicon, glass, GaAs or the like. Further, other elements can be disposed on the substrate 1. Therefore, a piezoelectric thin film resonator and a filter are devices suitably used for integration.

The lower electrode 2 and the upper electrode 4 can be formed of a laminate material such as aluminum (Al), copper (Cu), molybdenum (Mo), tungsten (W), tantalum (Ta), platinum (Pt), ruthenium (Ru), rhodium (Rb), iridium (Ir), chromium (Cr), titanium (Ti) and the like, or a combination thereof.

The piezoelectric film 3 can be formed of a material containing aluminum nitride (AlN), zinc oxide (ZnO), lead zirconate titanate (PZT), lead titanate (PbTiO$_3$) and the like. It is preferable that the piezoelectric film 3 is formed of AlN from the viewpoint of acoustic velocity, temperature characteristics, Q-value and easiness of film formation. Particularly, forming the piezoelectric film 3 with a highly-crystalline AlN film oriented in the c-axis direction (perpendicular to the surface of the lower electrode) is a factor for deciding the resonance characteristics, which imposes a direct influence on the coupling coefficient and the Q-value.

In forming such a highly-crystalline AlN film oriented in the taxis direction, it is preferred to apply high energy to the substrate during the film formation. For example, in a case of forming a film by using MOCVD (Metal Organic Chemical Vapor Deposition) technique, it is preferable that the substrate is heated at a temperature of not lower than 1000° C. Further, in a case of forming a film by using PECVD (Plasma Enhanced Chemical Vapor Deposition) technique, it is preferred to heat the substrate at temperature of not lower than 400° C. in addition to the plasma electric power. In a case of forming a film by using a sputtering technique, the substrate temperature rises. Therefore a typical AlN film will have a strong film stress.

In FIG. 6, a gap 6 swollen like a dome is formed between the lower face of the lower electrode 2 and the surface of the substrate 1 in the region where the upper electrode 4 and the lower electrode 2 overlap each other through the piezoelectric film 3 interposed therebetween. The gap 6 includes the region where the upper electrode 4 and the lower electrode 2 overlap, and it is in contact with the substrate 1 at the periphery. The gap 6 can be formed by removing a sacrificial layer that has been patterned under the lower electrode 2. In the substrate 1 or the lower electrode 2, an etchant-introducing hole (not shown) is formed. The etchant-introducing hole is used for introducing an etchant at the time of etching the sacrificial layer so as to form the gap 6.

Figure 7A:
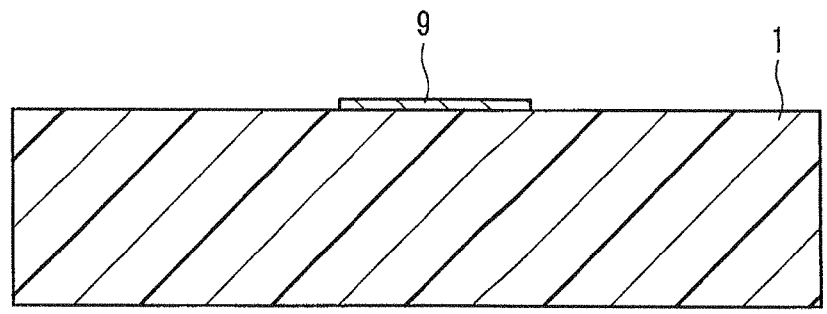
FIG. 7A is a cross-sectional view for explaining a process of manufacturing a piezoelectric thin film resonator, showing a state where a sacrificial layer is disposed on a substrate.
Figure 7B:
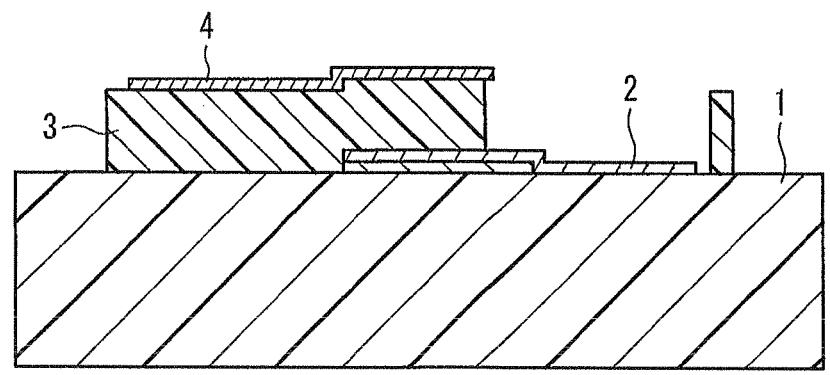
FIG. 7B is a cross-sectional view for explaining a process of manufacturing a piezoelectric thin film resonator, showing a state where a laminate film is disposed on a substrate.
Figure 7C:
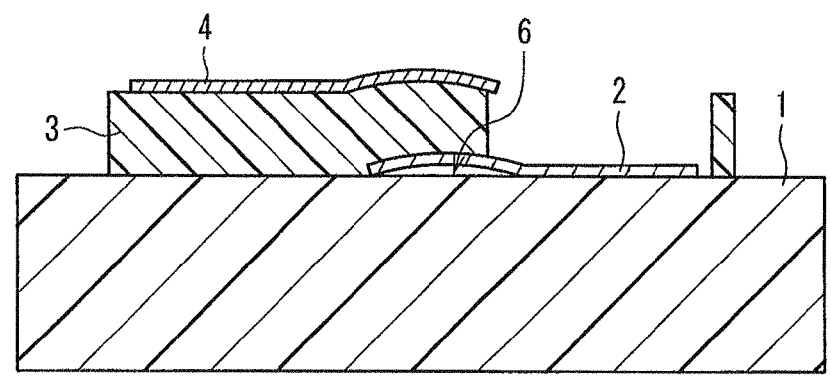
FIG. 7C is a cross-sectional view for explaining a process of manufacturing a piezoelectric thin film resonator, showing a state where a sacrificial layer is removed.

FIGS. 7A-7C are views for explaining the process for manufacturing a piezoelectric thin film resonator as shown in FIG. 6. FIGS. 7A-7C are cross-sectional views showing a piezoelectric thin film resonator in the manufacturing process.

First, as shown in FIG. 7A, a sacrificial layer 9 is applied on the substrate 1 formed of Si, by sputtering or a vapor deposition. Here, the substrate 1 can be made of quartz. It is preferable that the sacrificial layer 9 is formed of magnesium oxide (MgO) having a thickness of about 20 to about 100 nm. The material of the sacrificial layer 9 is not limited to MgO but any materials such as ZnO, Ge, Ti and SiO$_2$ can be used as long as the material can be dissolved easily in the etchant.

Next, the sacrificial layer 9 is patterned to have a desired shape by the lithographic technology and the etching technology. Here, the sacrificial layer 9 is patterned to have a shape a little larger than the region where the upper electrode 4 and the lower electrode 2 overlap each other.

Next, as shown in FIG. 7B, the lower electrode 2, the piezoelectric film 3 and the upper electrode 4 are formed in this order. The lower electrode 2 is formed by sputtering in an Ar gas atmosphere under a pressure of 0.6 to 1.2 Pa. Further, by the lithographic technology and the etching technology, the lower electrode 2 is patterned to have a desired shape. The piezoelectric film 3 is formed by sputtering AlN using an Al target in an Ar/N$_2$ gaseous mixture atmosphere under a pressure of about 0.3 Pa. The upper electrode 4 is formed by sputtering a Ru film in an Ar gas atmosphere under a pressure of 0.6 to 1.2 Pa. These sputtering conditions are presented as an example, and the conditions are set preferably so that the stress of a laminate film including the lower electrode 2, the piezoelectric film 3 and the upper electrode 4 is the compressive stress. This laminate film is subjected to photolithography and etching, so that the upper electrode 4 and the piezoelectric film 3 are patterned to have desired shapes. The etching denotes either a wet etching process or a dry etching process.

Here, as shown in FIG. 7B, it is preferable that at least a part of the periphery of the piezoelectric film 3 is positioned inside the periphery of a region where the upper electrode 4 and the lower electrode 2 oppose each other. This structure serves to prevent leakage of an acoustic wave in the transverse direction and to improve the resonance characteristics.

Next, as shown in FIG. 7C, an etchant-introducing hole (not shown) is formed in the lower electrode 2. The etchant-introducing hole can be formed using photolithographic technology and the etching technology. Next, via the etchant-introducing hole, an etchant is introduced below the lower electrode 2, thereby etching to remove the sacrificial layer 9. As a result of removing the sacrificial layer 9, the gap 6 can be formed. Alternatively, the etchant-introducing hole can be formed at the time of etching the lower electrode 2.

At the time that the etching of the sacrificial layer 9 is completed by means of the compressive stress applied to the laminate film, the laminate film is swollen and thus the gap 6 is formed between the lower electrode 2 and the substrate 1. Therefore, the laminate film has a hollow structure.

In the above-mentioned sputtering film formation condition, the stress applied to the laminate film is a compressive stress of approximately (minus) 300 MPa.

The sputtering condition according to the present embodiment is just an example. In formation of a dome-shaped gap, it is important to apply compressive stress to the laminate film. For the sputtering, various combinations will be available. Even when the laminate film is formed by use of any other film-formation method, it is possible to form a dome-like gap by adjusting the stress applied to the laminate film.

Figure 8A:
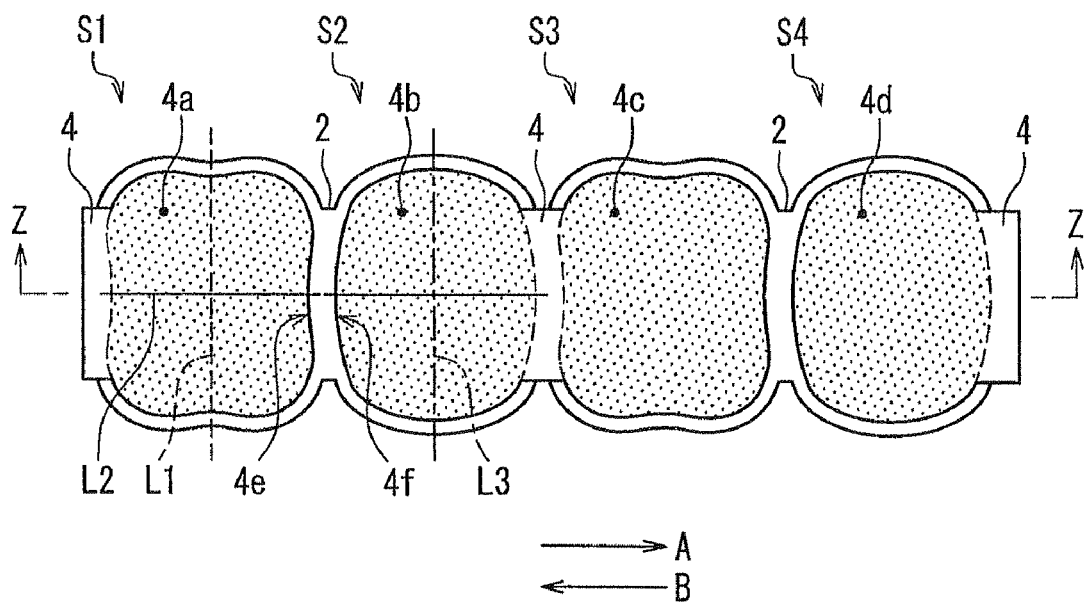
FIG. 8A is a top view showing a piezoelectric thin film resonator according to an embodiment of the present invention.
Figure 8B:
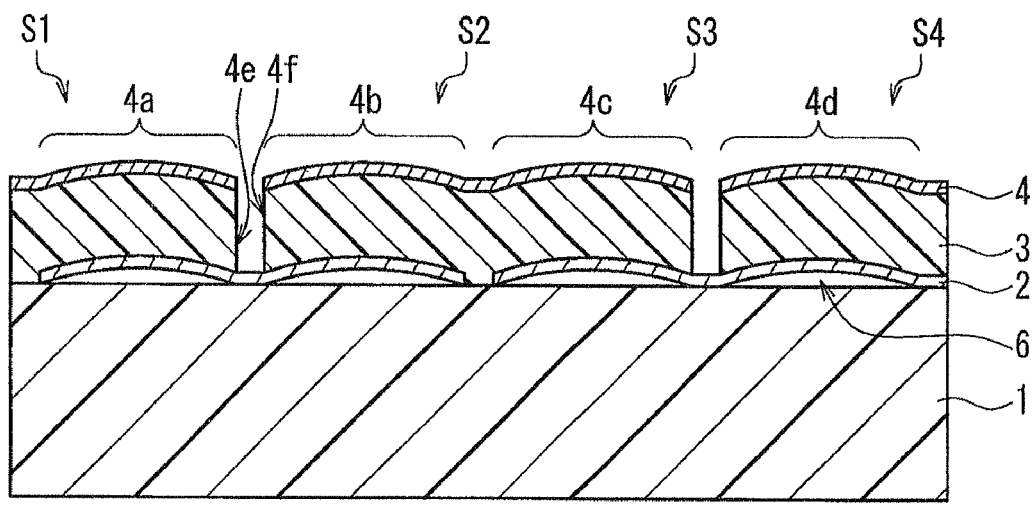
FIG. 8B is a cross-sectional view taken along the line Z-Z in FIG. 8A.

FIG. 8A is a top view showing a filter using piezoelectric thin film resonators according to the present embodiment. FIG. 8B is a cross-sectional view taken along the line Z-Z in FIG. 8A. FIGS. 8A and 8B show the structure of the serial resonators S1-S4 in the ladder-type filter shown in FIG. 5. The serial resonators S1-S4 are piezoelectric thin film resonators. The serial resonators S1-S4 can be manufactured according to the manufacturing process as shown in FIGS. 7A-7C. The dotted regions in FIG. 8A denote regions 4a-4d where the upper electrode 4 and the lower electrode 2 overlap each other. In the present specification, each of the regions 4a-4d is referred to as "electrode region" and the shape of the electrode region is referred to as "electrode shape". As shown in FIG. 8A, each of the respective electrode regions 4a-4d is shaped to include a curve in the perimeter.

The electrode regions of piezoelectric thin film resonators adjacent to each other are shaped to have opposing parts complimentary to each other. For example, an edge 4e of an electrode region 4a opposing an electrode region 4b is bowed toward the center of the electrode region 4a. An edge 4f of the electrode region 4D opposing the electrode region 4a is bowed in a direction opposite to the center of the electrode region 4b. Namely, the edge 4e and the edge 4f are shaped complimentarily to each other. The edge 4e and the edge 4f are substantially parallel to each other. The spacing between the edge 4e and the edge 4f opposing each other is constant. Similarly, the electrode region 4b and the electrode region 4c are shaped complimentarily to each other, and the electrode region 4c and the electrode region 4d are shaped complimentarily to each other.

As shown in FIG. 8A, the respective piezoelectric thin film resonators are shaped substantially linear symmetric about a dotted line L1, a solid line L2, and an alternate long and short dash line L3. For example, the piezoelectric thin film resonator S1 is shaped substantially linear symmetric about the dotted line L1 and the solid line L2. The piezoelectric thin film resonator S2 is shaped substantially linear symmetric about the alternate long and short dash line L3 and the solid line L2. The symmetry axes indicated by the dotted line L1 and the alternate long and short dash line L3 are perpendicular substantially to the direction of current flowing in the direction indicated by the arrow A or the arrow B. The symmetry axis indicated by the solid line L2 is substantially parallel to the current flowing in the direction indicated by the arrow A or the arrow B.

Figure 9A:
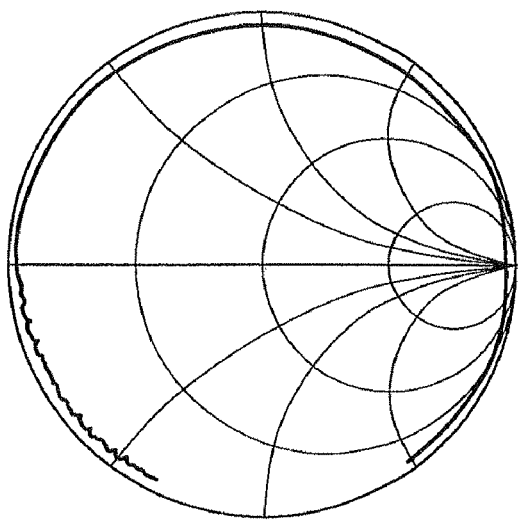
FIG. 9A is a Smith chart showing a resonance characteristic of the piezoelectric thin film resonator of the present embodiment.
Figure 9B:
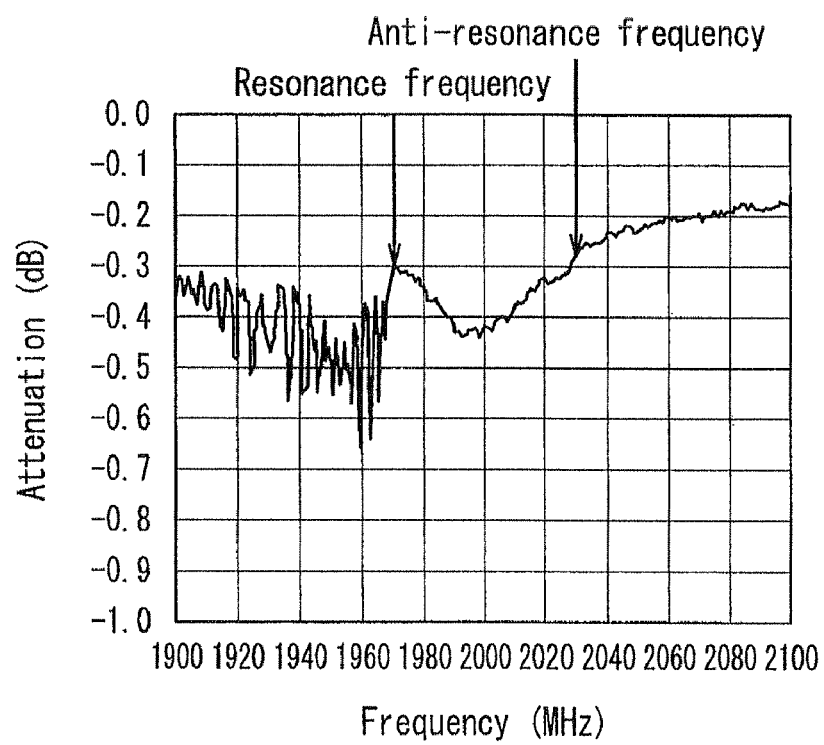
FIG. 9B is a graph showing a resonance characteristic of a piezoelectric thin film resonator according to the present embodiment.
Figure 10A:
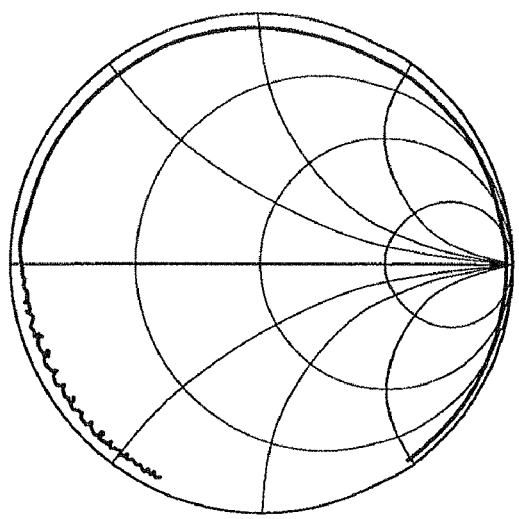
FIG. 10A is a Smith chart showing a resonance characteristic of the piezoelectric thin film resonator of the present embodiment.
Figure 10B:
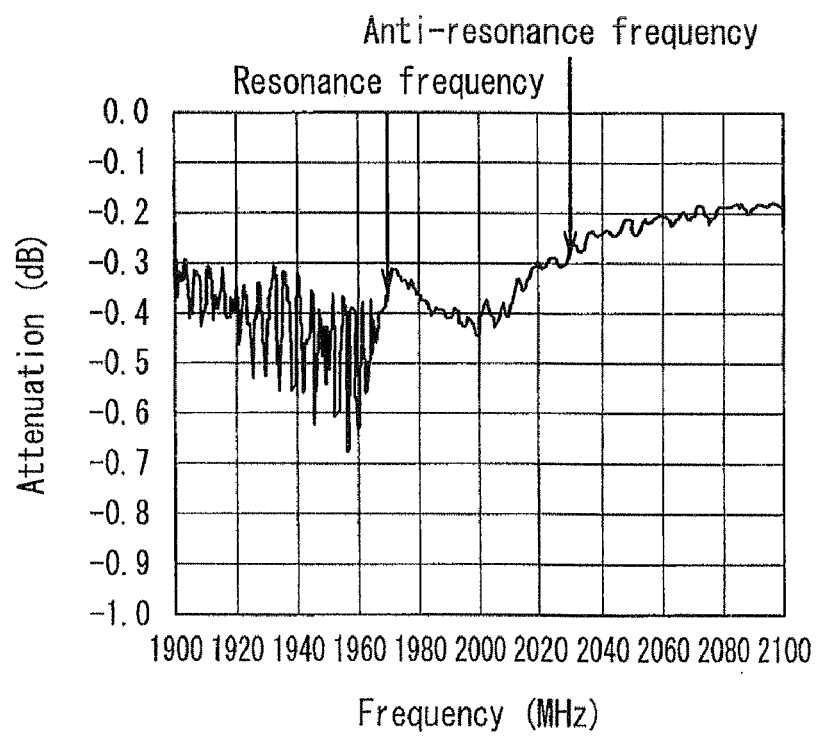
FIG. 10B is a graph showing a resonance characteristic of a piezoelectric thin film resonator according to the present embodiment.
Figure 11A:
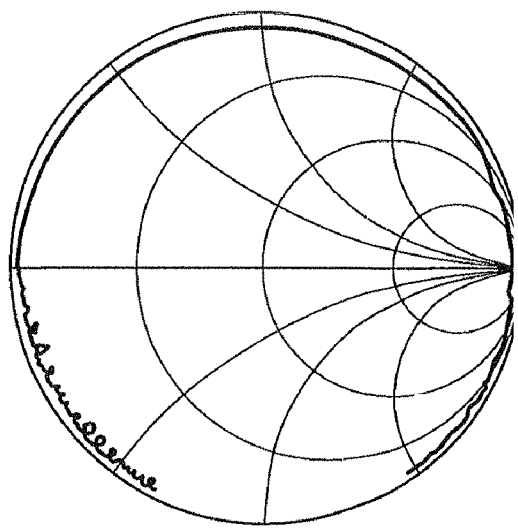
FIG. 11A is a Smith chart showing a resonance characteristic of a conventional piezoelectric thin film resonator.
Figure 11B:
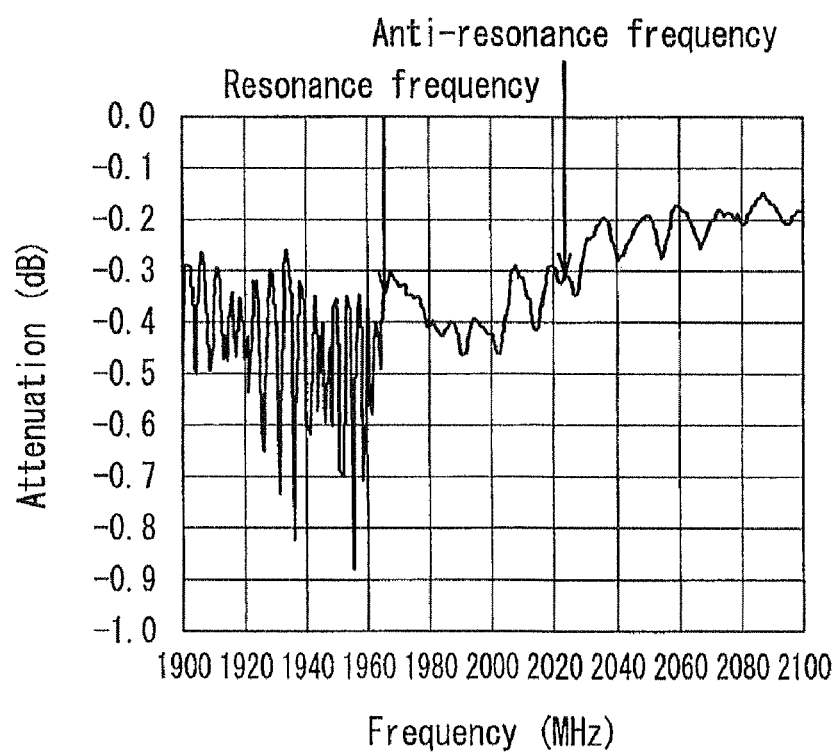
FIG. 11B is a graph showing a resonance characteristic of a conventional piezoelectric thin film resonator.

FIGS. 9A-10B show the resonance characteristics of the piezoelectric thin film resonator of the present embodiment. FIGS. 11A and 11B show the resonance characteristics of a piezoelectric thin film resonator in a comparative example with respect to the present embodiment. FIGS. 9A, 10A and 11A are Smith charts of the resonance characteristics. FIGS. 9B, 10B and 11B are line graphs of the resonance characteristics. FIGS. 9A and 9B show the resonance characteristics of the piezoelectric thin film resonators S1, S3 in FIGS. 8A and 8B. FIGS. 10A and 10B show the resonance characteristics of the piezoelectric thin film resonators S2 and S4. FIGS. 11A and 11B show the resonance characteristics of the piezoelectric thin film resonators having rectangular electrode regions. In this comparative example, the area of each rectangular electrode region in the piezoelectric thin film resonator is set to 162 μm×135 μm. Here for instance, the area of each electrode region in the piezoelectric thin film resonator of the present embodiment is equal to the area of the counterpart in the comparative example.

The graphs of FIGS. 9B, 10B and 11B indicate the return loss of the one-port characteristics with respect to the frequency. The graphs of FIGS. 9B, 10B and 11B imply that the loss is reduced as the attenuation is closer to 0 dB, namely the quality factor Q of the resonator is higher. In each of the Smith charts of FIGS. 9A, 10A and 11A, the circle with the larger diameter implies that the loss is smaller and the quality factor Q of the resonator is higher. In a comparison of resonance characteristics between the piezoelectric thin film resonator of the present embodiment and the (rectangular) piezoelectric thin film resonator in the comparative example, a significant difference is observed in the spurious in the whole frequency bands and at a frequency not higher than the resonant frequency. This spurious is caused by the transverse mode undesired wave of the piezoelectric thin film resonator, and it strongly relies on the shape of the electrode region. Particularly in a case of a filter having piezoelectric thin film resonators connected to a serial arm, spurious of not higher than the resonant frequency appears as ripples in the passband, and it is undesired from the practical viewpoint. When minute arrangement or high-density packaging of the piezoelectric thin film resonators is taken into consideration, the arrangement space efficiency can be improved by shaping the electrode regions rectangular. However, problems in characteristics as mentioned above still remain. In contrast, the piezoelectric thin film resonators S1-S4 as shown in FIGS. 8A and 8B suppress spurious and further serve to improve the arrangement space efficiency.

In the piezoelectric thin film resonator of the present embodiment, the laminate film including the upper electrode 4, the piezoelectric film 3 and the lower electrode 2 has a hollow structure. Thus consideration to the mechanical strength is important in discussion of the reliability of elements.

Figure 12A:
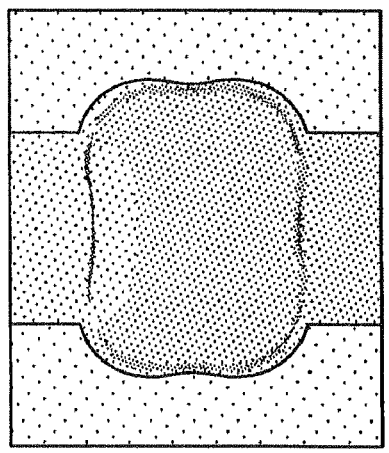
FIG. 12A is a schematic view showing a stress distribution of a piezoelectric thin film resonator according to an embodiment of the present invention.
Figure 12B:
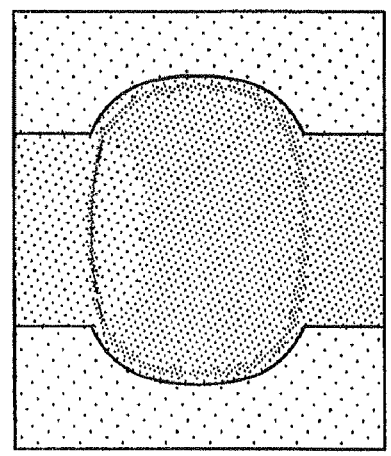
FIG. 12B is a schematic view showing a stress distribution of a piezoelectric thin film resonator according to an embodiment of the present invention.
Figure 12C:
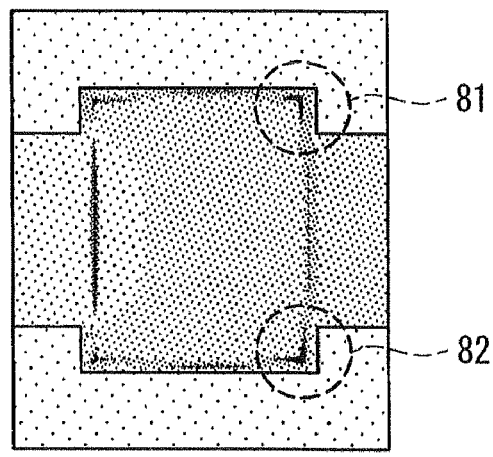
FIG. 12C is a schematic view showing a stress distribution of a piezoelectric thin film resonator having corners.
Figure 12D:
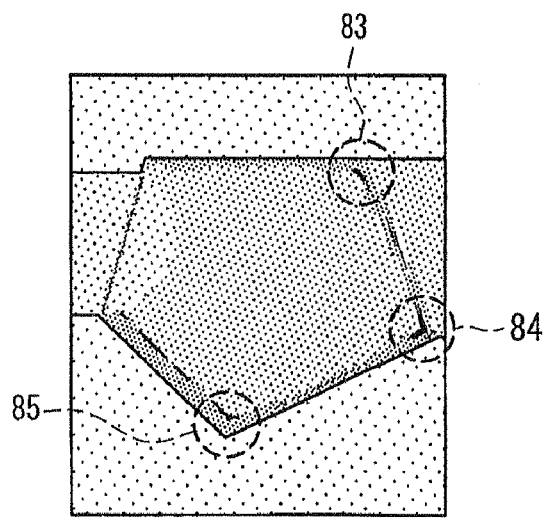
FIG. 12D is a schematic view showing a stress distribution of a conventional piezoelectric thin film resonator.

FIGS. 12A-12D show results of structural analyses by a finite element method regarding piezoelectric thin film resonators having hollow structures. FIGS. 12A-12D show respectively a residual stress distribution in a region where the upper electrode and the lower electrode oppose each other through the piezoelectric film interposed therebetween. In the results on structural analyses shown in FIGS. 12A-12D, the differences in the residual stress depending on the shapes of the electrode regions are clarified by unifying the conditions for stress applied to the laminate layers. FIG. 12A shows the analytic result for the residual stress of the piezoelectric thin film resonators S1 and S3 of the present embodiment. FIG. 12B shows the analytic result for the residual stress of the piezoelectric thin film resonators S2 and S4 of the present embodiment. FIG. 12C shows the analytic result for the residual stress of the piezoelectric thin film resonators having rectangular electrode regions. FIG. 12D shows the analytic result for the residual stress of the piezoelectric thin film resonators disclosed in Document 1. The piezoelectric thin film resonator disclosed in Document 1 has a non-square electrode with no pairs of sides parallel to each other. For example, the piezoelectric thin film resonator disclosed in Document 1 has an irregular-pentagonal electrode.

In FIGS. 12A-12D, with regard to the residual stress observed around the region where the upper electrode 4 and the lower electrode 2 overlap each other through the piezoelectric film 3, it is considered that the margin to fracture is reduced for the site where more residual stress remains. First, as shown in FIGS. 12C and 12D, in piezoelectric thin film resonators having electrode regions with only straight outlines, intense residual stress is generated in corner regions 81-85. In contrast, in piezoelectric thin film resonators having electrode regions with outlines of curves as shown in FIGS. 12A and 12B, the stress concentration as shown in FIGS. 12C and 12D rarely occurs and the absolute value of the residual stress is low. Namely, since stress concentration will not occur easily in a piezoelectric thin film resonator having an electrode region with an outline including a curve (the piezoelectric thin film resonator according to the present embodiment), a larger tolerance of stress to be applied to the laminate film can be secured, and thus the piezoelectric thin film resonator can be manufactured easily.

Each of the piezoelectric thin film resonators shown in FIGS. 12A-12C has a symmetry axis substantially perpendicular to the direction of current flow. The piezoelectric thin film resonator shown in FIG. 12D does not have a symmetry axis substantially perpendicular to the direction of current flow, and the residual stress has no symmetry. If the residual stress does not have symmetry, the hollow structure will have an uneven intensity distribution, and it is not desirable from the viewpoint of mechanical strength. Even when the electrode shape has a symmetry axis, in a case where the symmetry axis is not substantially either perpendicular or parallel to the direction of the current, the residual stress will have an uneven distribution in the vicinity of the region where the upper electrode 4 and the lower electrode 2 overlap each other through the piezoelectric film 3, and it is not desirable from the viewpoint of mechanical strength.

Figure 13A:
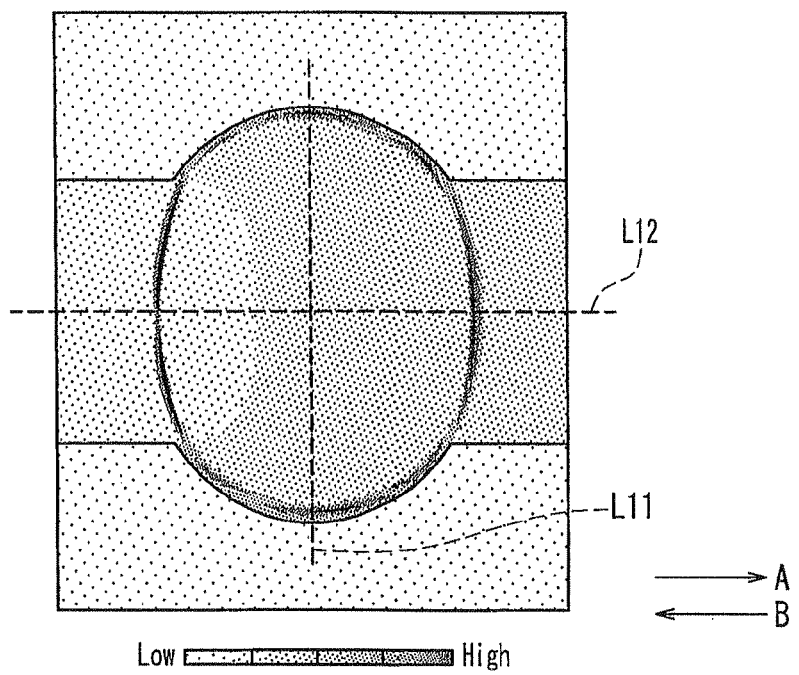
FIG. 13A is a schematic view showing a stress distribution of a piezoelectric thin film resonator according to an embodiment of the present invention.
Figure 13B:
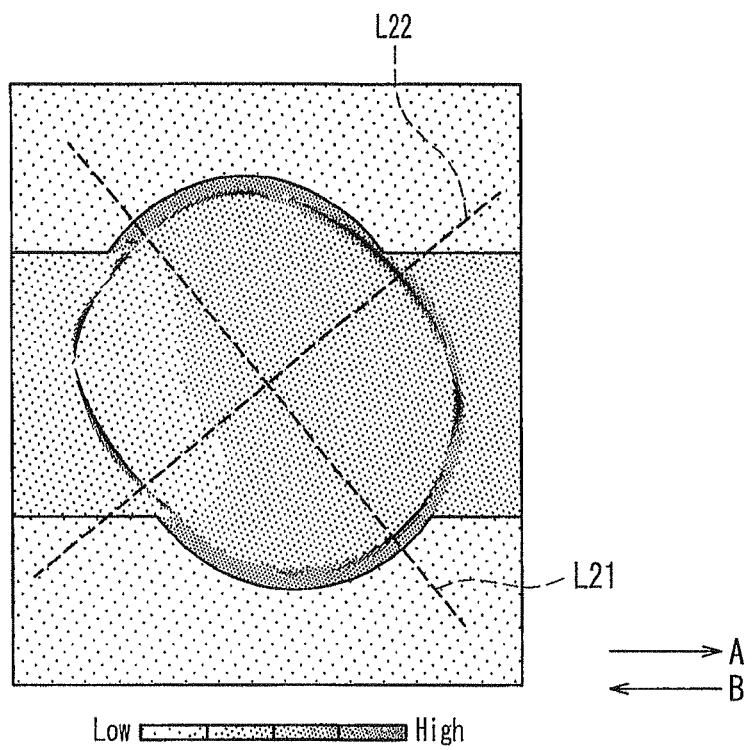
FIG. 13B is a schematic view showing a stress distribution of a piezoelectric thin film resonator with an inclined symmetry axis.

FIG. 13A shows an analytic result for residual stress in a case where symmetry axes of an electrode region are substantially perpendicular to the direction of a current flow. FIG. 13B shows an analytic result for residual stress in a case where symmetry axes of an electrode region are not substantially perpendicular to the direction of a current flow. FIG. 13A shows the analytic result for the residual stress in the electrode region of any of the piezoelectric thin film resonators S2, S4 according to the present embodiment. Asymmetry axis L11 in FIG. 13A is substantially perpendicular to the direction of current and a symmetry axis L12 is substantially parallel to the direction of current. FIG. 13B shows the analytic result for the residual stress in the electrode region for the case where the piezoelectric thin film resonators S2, S4 are inclined with respect to the current direction (direction indicated by the arrow A or B). When the symmetry axis of the piezoelectric thin film resonator is inclined with respect to the direction of current, the residual stress becomes partial as shown in FIG. 13B. When the symmetry axis of the piezoelectric thin film resonator is inclined with respect to the direction of current, a useless space is formed between two adjacent piezoelectric thin film resonators. This is unfavorable also from the viewpoint of minute arrangement or high-density packaging.

Figure 1:
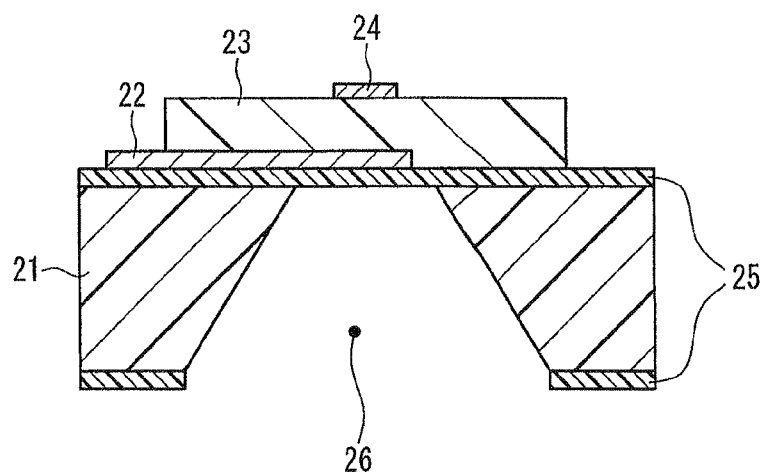
FIG. 1 is a cross-sectional view showing a conventional piezoelectric thin film resonator (FBAR).
Figure 2:
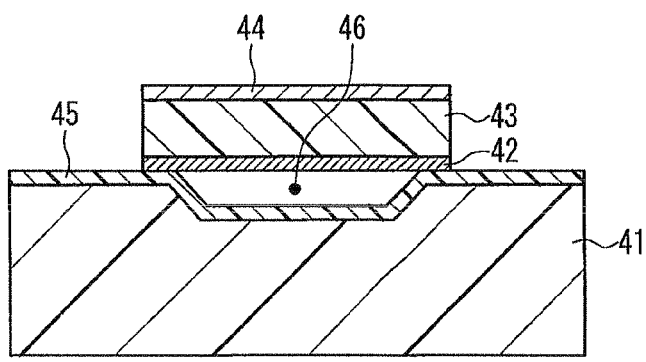
FIG. 2 is a cross-sectional view showing a conventional piezoelectric thin film resonator (FBAR).
Figure 3:
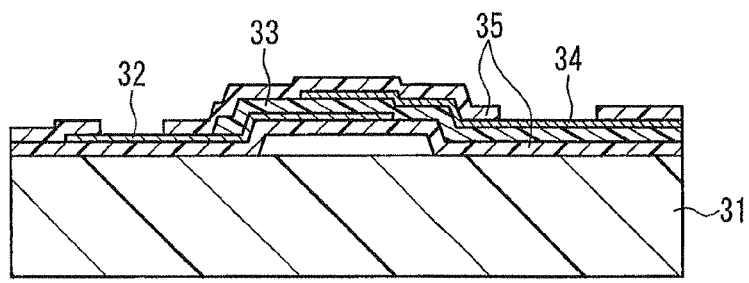
FIG. 3 is a cross-sectional view showing a conventional piezoelectric thin film resonator (FBAR).
Figure 4:
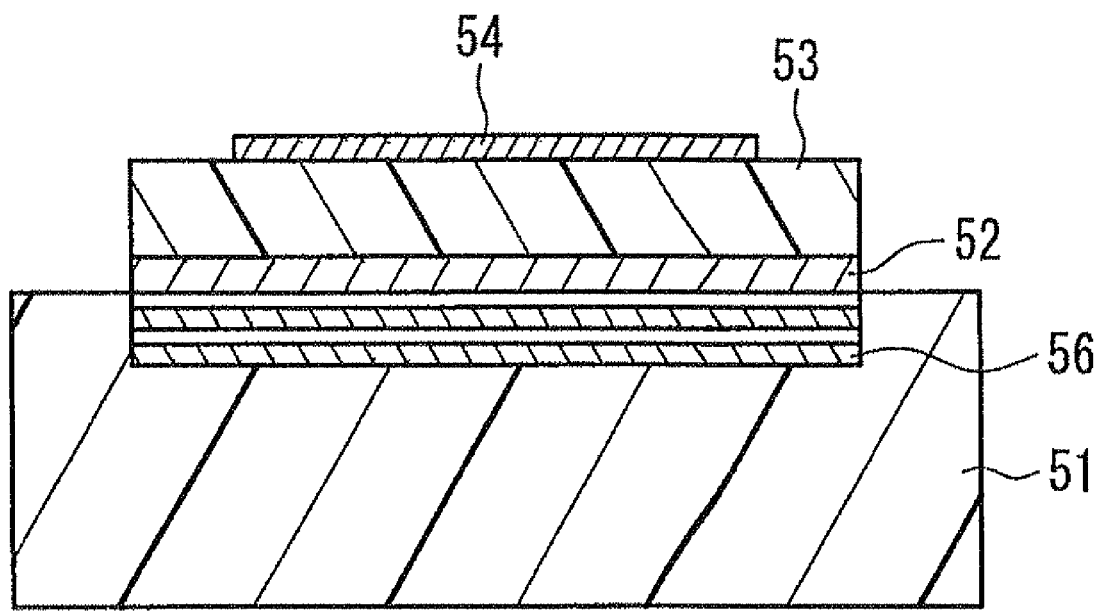
FIG. 4 is a cross-sectional view showing a conventional piezoelectric thin film resonator (SMR).

Moreover, a flat substrate whose surface remains untreated is used for the substrate 1 in the manufacturing process as shown in FIGS. 7A-7B. Therefore, the manufacturing process steps can be decreased and the manufacturing cost can be reduced in comparison with the process for manufacturing the piezoelectric thin film resonator as shown in FIG. 2. According to the piezoelectric thin film resonator of the present embodiment, the productivity can be improved.

Although the present embodiment refers to piezoelectric thin film resonators connected to a serial arm, a substantially same embodiment can be applied to piezoelectric thin film resonators connected to parallel arms. For a ladder-type filter, the filter size can be decreased by decreasing the length of the parallel arms. For such a ladder-type filter, the filter size can be decreased further effectively by decreasing the length of the serial arm. For the purpose of decreasing the length of the serial arm, minute arrangement of the piezoelectric thin film resonators and flattening the resonators are effective. In the case of the piezoelectric thin film resonator shown in FIGS. 8A and 8B, "flattening" indicates that the piezoelectric thin film resonator is elongated in the axial direction of the symmetry axis indicated with the dotted line L1 or the alternate long and short dash line L3 (the direction substantially perpendicular to the direction of current of the piezoelectric thin film resonator) and shortened in the axial direction of the symmetry axis indicated with the solid line L2.

Furthermore, for the filter of the present embodiment, the element size can be reduced by decreasing the spacing between the piezoelectric thin film resonators. Further since the wiring resistance between the piezoelectric thin film resonators can be decreased by decreasing the spacing between the piezoelectric thin film resonators, the filter loss can be lowered.

Figure 14:
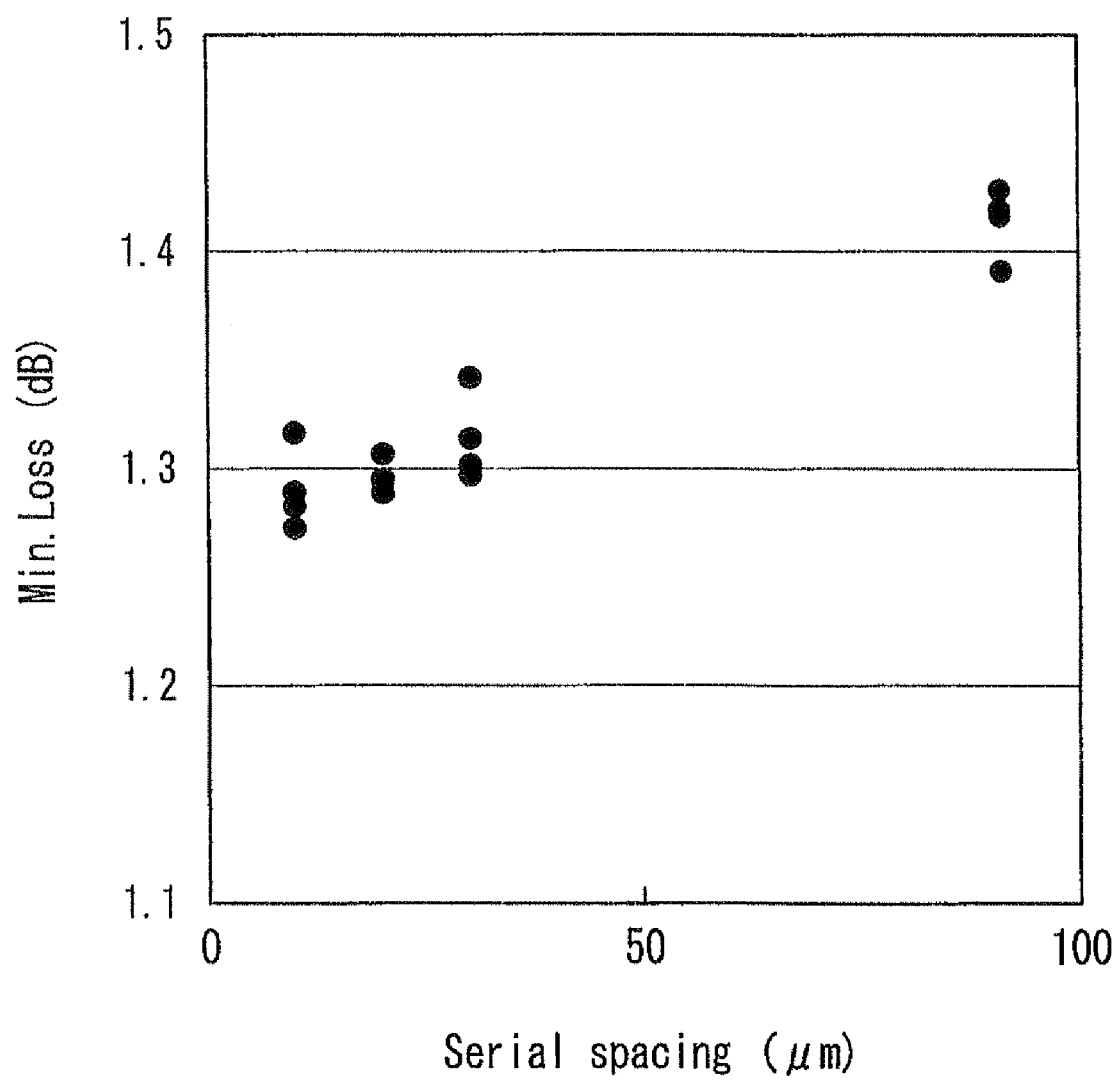
FIG. 14 is a characteristic diagram showing a relationship between the spacing among piezoelectric thin film resonators and a minimum loss.

FIG. 14 shows a change in the minimum loss of the filter-pass characteristic in a case of changing the spacing between the piezoelectric thin film resonators in a serial arm. As clearly shown in FIG. 14, the minimum loss is reduced with the decrease of the spacing between the piezoelectric thin film resonators. For the purpose of reducing the spacing between the piezoelectric thin film resonators, it is effective to arrange minutely each of the respective piezoelectric thin film resonators by shaping the electrode to be complementary at a part opposing an electrode of an adjacent piezoelectric thin film resonator.

[2. Second Configuration of the Piezoelectric Thin Film Resonator]

Figure 15:
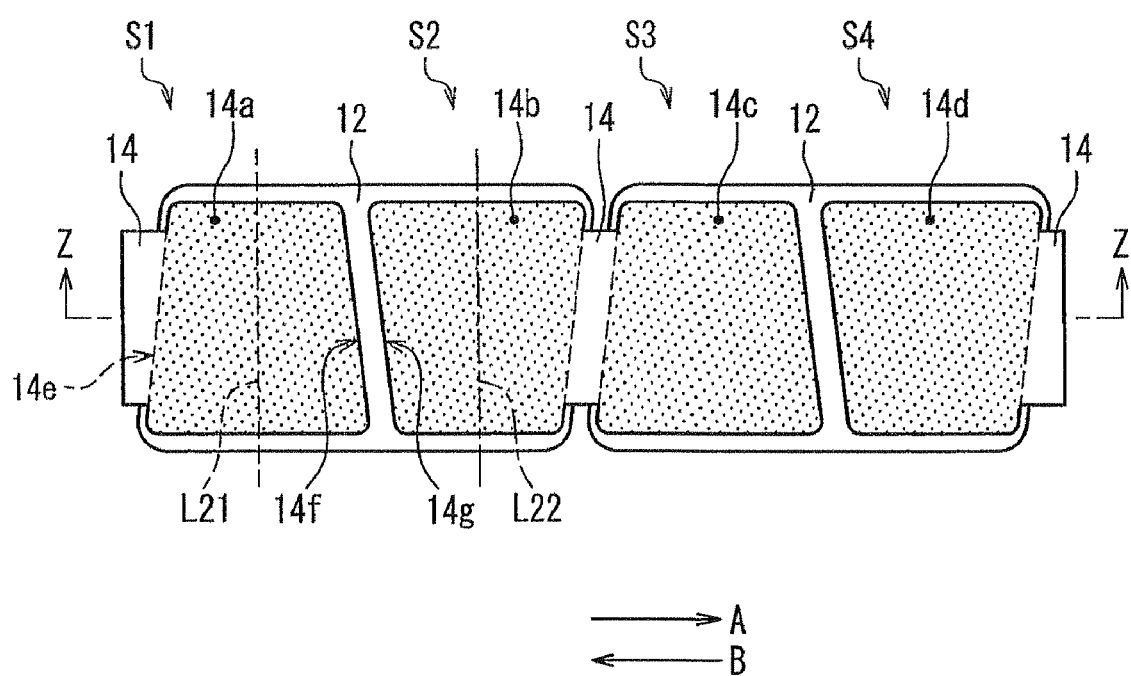
FIG. 15 is a top view showing another structural example of a piezoelectric thin film resonator according to the present embodiment.

FIG. 15 shows a second configuration of a piezoelectric thin film resonator included in a filter according to the present embodiment. The piezoelectric thin film resonator shown in FIG. 15 is employed for the serial resonators S1-S4 of the ladder-type filter as shown in FIG. 5. The cross-sectional view taken along the line Z-Z in FIG. 15 is similar to that in FIG. 8B as mentioned above. The piezoelectric thin film resonators of the present embodiment can be manufactured according to the manufacturing process as shown in FIGS. 7A-7C. In FIG. 15, the dotted regions are the regions 14a-14d (electrode regions) where an upper electrode 14 and a lower electrode 12 overlap each other. Each of the electrode regions is shaped so that a pair of opposing sides are non-parallel to each other; and the spacing between the overlapping regions of adjacent piezoelectric thin film resonators (regions where the upper electrode and the lower electrode overlap each other) is substantially constant. For the electrode region 14a, the opposing sides denote an edge 14e and an edge 14f. The spacing of overlapping regions denotes, for example, the spacing between the edge 14f of the electrode region 14a and the edge 14g of the electrode region 14b. Each of the piezoelectric thin film resonators is shaped substantially linear symmetric with respect to the dotted line L21 or the alternate long and short dash line L22 as shown in FIG. 15. The symmetry axes indicated with the dotted line L21 and the alternate long and short dash line L22 are substantially perpendicular to the direction of the current flowing in the direction indicated with the arrow A or B.

Figure 16A:
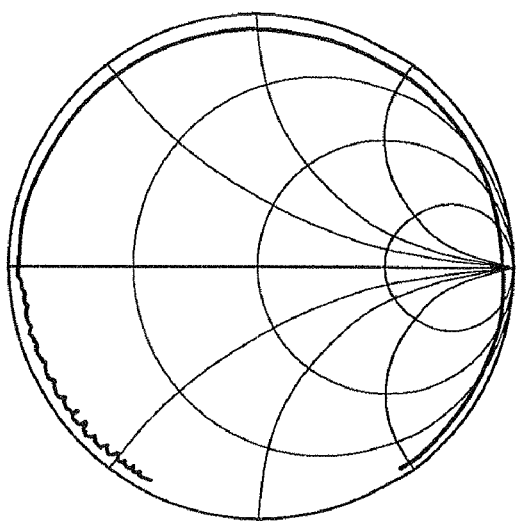
FIG. 16A is a Smith chart showing a resonance characteristic of the piezoelectric thin film resonator shown in FIG. 15.
Figure 16B:
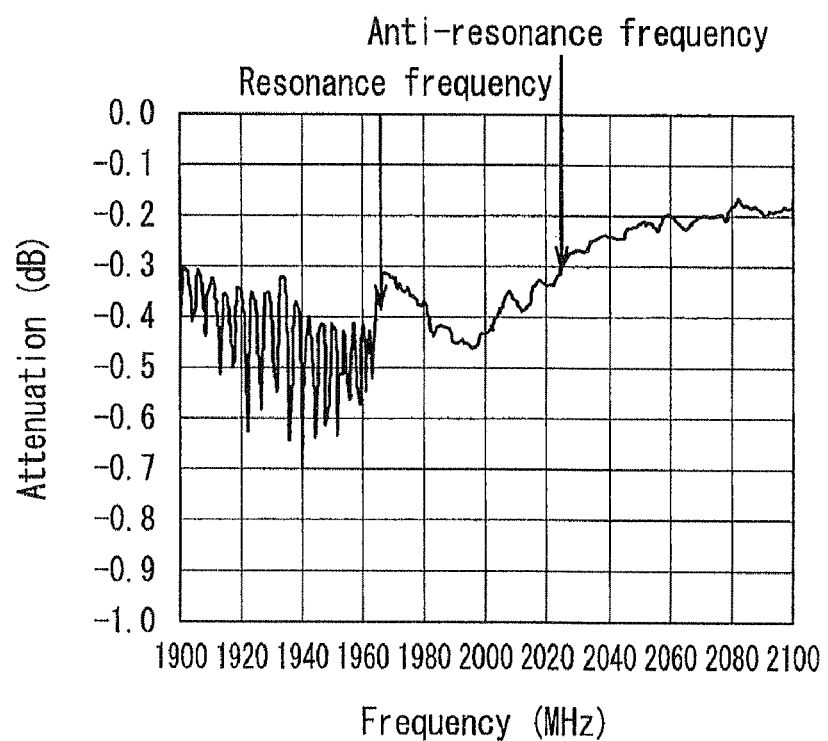
FIG. 16B is a graph showing a resonance characteristic of the piezoelectric thin film resonator shown in FIG. 15.

FIGS. 16A and 16B show the resonance characteristics of the piezoelectric thin film resonator according to the present embodiment. The piezoelectric thin film resonator from which the resonance characteristics as shown in FIGS. 16A and 16B are obtained has the shape as shown FIG. 15. The area of the electrode region of the piezoelectric thin film resonator is equal to that of the electrode region having a rectangular shape in the piezoelectric thin film resonator (see FIGS. 11A and 11B). FIGS. 16A and 16B show a return loss of the one-port characteristic with respect to the frequency. When the resonance characteristics of the piezoelectric thin film resonator having the electrode region of the present embodiment are compared with the counterpart as shown in FIGS. 11A and 11B, considerable differences are observed in the spurious across the whole frequency region, particularly in the region not higher than the resonant frequency.

By using the piezoelectric thin film resonators of the present embodiment to a filter, the spacing between the piezoelectric thin film resonators can be decreased, and thus the respective piezoelectric thin film resonators can be arranged minutely. Thereby a smaller filter can be provided. Furthermore, since the wiring resistance between the piezoelectric thin film resonators can be reduced, the filter loss can be reduced.

[3. Structure of Duplexer]

Figure 17:
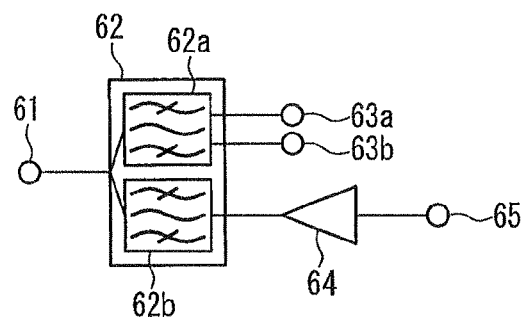
FIG. 17 is a block diagram of a duplexer.

FIG. 17 shows an example of duplexer including piezoelectric thin film resonators of the present embodiment or the above-described filters. As shown in FIG. 17, a duplexer 62 includes a reception filter 62a and a transmission filter 62b. To the reception filter 62a, reception terminals 63a and 63b corresponding to a balanced output are connected for example. The transmission filter 62b is connected to a transmission terminal 65 via a power amplifier 64. In an alternative configuration, a matching circuit (a phase shifter, for example) can be added between the antenna terminal and the respective filters as required for the purpose of impedance adjustment. Here, the piezoelectric thin film resonators according to the present embodiment are included in both the reception filter 62a and the transmission filter 62b.

At the time of a reception operation, the reception filter 62a passes only the signal in a predetermined frequency band among the reception signals that are inputted via the antenna terminal 61, and outputs the signal via the reception terminals 63a and 63b to the exterior. At the time of a transmission operation, the transmission filter 62b passes only the signal in a predetermined frequency band among the transmission signals that have been inputted from the transmission terminal 65 and amplified at the power amplifier 64, and outputs the signal via the antenna terminal 61 to the exterior.

Either the piezoelectric thin film resonators or the filters according to the present embodiment are provided to the reception filter 62a and to the transmission filter 62b of the duplexer, thereby suppressing the influences of the transverse mode undesired wave in the piezoelectric thin film resonators. Therefore, a small duplexer with excellent productivity can be provided without sacrificing the mechanical strength of an electrode having a hollow structure.

The configuration of the duplexer is not limited to the example as shown in FIG. 17. Similar effects can be obtained even by packaging a filter including the piezoelectric thin film resonators of the present embodiment to a communication module including a duplexer having a different configuration.

[4. Configuration of a Communication Apparatus]

Figure 18:
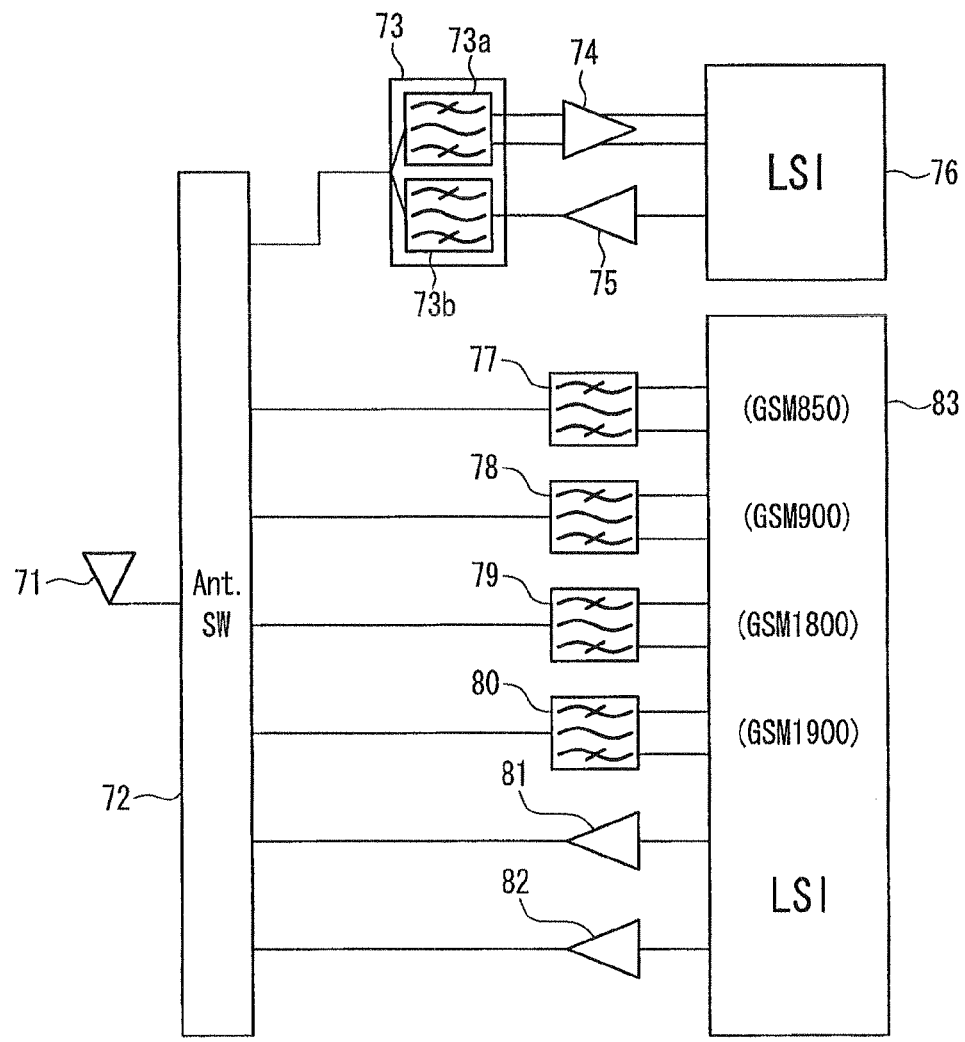
FIG. 18 is a block diagram of a communication apparatus.

FIG. 18 is a block diagram showing a communication apparatus including a communication module of the present embodiment. The communication apparatus shown in FIG. 18 is a RF block of a mobile phone terminal as an example of a communication apparatus. The communication apparatus as shown in FIG. 18 is included in a mobile phone terminal corresponding to a GSM (Global System for Mobile) communication system and a W-CDMA (Wideband Code Division Multiple Access) communication system. The GSM communication system according to the present embodiment corresponds to the 850 MHz band, the 950 MHz band, the 1.8 GHz band, and the 1.9 GHz band Though the mobile phone terminal includes a microphone, a speaker, a liquid crystal display and the like in addition to the structure as shown in FIG. 18, the components are not shown here since they are not necessary for discussion of the present embodiment. Here, either the piezoelectric thin film resonators or the filters according to the present embodiment are included in the reception filters 73a, 77, 78, 79, 80 and the transmission filter 73b.

First, regarding a reception signal inputted via an antenna 71, an antenna switching circuit 72 selects the LSI to be subjected to the operation, depending on the communication system (whether the W-CDMA or the GSM). When the inputted reception signal corresponds to the W-CDMA communication system, switching takes place in order to output the reception signal to a duplexer 73. The reception signal inputted to the duplexer 73 is restricted to a predetermined frequency band at the reception filter 73a and thus a balanced reception signal is outputted to a LNA 74. The LNA 74 amplifies the inputted reception signal and outputs the signal to a LSI 76. The LSI 76 carries out decoding to an audio signal on the basis of the inputted reception signal, or controls the operations of the respective parts within the mobile phone terminal.

In a case of transmitting a signal, the LSI 76 generates a transmission signal. The thus generated transmission signal is amplified at the power amplifier 75 and inputted into the transmission filter 73b. The transmission filter 73b passes only the signal in a predetermined frequency band among the inputted transmission signals. The transmission signal outputted by the transmission filter 73b is outputted from the antenna 71 to the exterior via the antenna switching circuit 72.

When the reception signal to be inputted corresponds to the GSM communication system, the antenna switching circuit 72 selects any one of the reception filters 77-80 in accordance with the frequency band, and outputs the reception signal. The reception signals subjected to a band-restriction at any of the reception filters 77-80 are inputted into the LSI 83. The LSI 83 carries out decoding to an audio signal on the basis of the inputted reception signal, or controls the operations of the respective parts within the mobile phone terminal. In a case of transmitting a signal, the LSI 83 generates a transmission signal. The thus generated transmission signal is amplified at the power amplifier 81 or 82, and outputted from the antenna 71 to the exterior via the antenna switching circuit 72.

By providing the filter or the communications module using the piezoelectric thin film resonators of the present embodiment to the communication apparatus, the influences caused by the transverse mode undesired wave of the piezoelectric thin film resonator can be suppressed. Therefore, a small duplexer with excellent productivity can be provided without sacrificing the mechanical strength of an electrode having a hollow structure.

Though the embodiment of the present invention has been described above in detail, the present invention is not restricted to such a specific embodiment but can be modified or varied variously without deviating the range of the present invention as described in claims.

For example, silicon, glass, GaAs or the like can be used for the material of substrate, and furthermore, a substrate on which another element has been provided can be used.

For the material of the electrodes, a laminate material selected from the elements below can be used: aluminum (Al), copper (Cu), molybdenum (Mo), tungsten (W), tantalum (Ta), platinum (Pt), ruthenium (Ru), rhodium (Rh), iridium (Ir), chromium (Cr), titanium (Ti) and the like, or a combination thereof.

For the material of the piezoelectric film, aluminum nitride (AlN), zinc oxide (ZnO), lead zirconate titanate (PZT), lead titanate ($PbTiO_3$) and the like can be used. In many cases, AlN is used for the material of the piezoelectric film from the viewpoint of acoustic velocity, temperature characteristics, Q-value and easiness of film formation.

The film configuration in the above-described embodiment refers to only main components of the piezoelectric thin film resonator. It is also possible for example, to provide a dielectric film on the upper electrode. The dielectric film on the upper electrode functions as a passivation film or for adjustment of frequency.

Also it is possible to provide a pad portion based on Au or the like to be an underlayer for a case of wire-connection or bump connection to an external circuit, to the input/output terminal or to a grounding terminal. It is possible to form an Au pattern between the piezoelectric thin film resonators at the same time of forming the pad portion.

[5. Effect of the Present Embodiment, and the Like]

According to the present embodiment, it is possible to suppress the influence of transverse mode undesired wave of the piezoelectric thin film resonators. Therefore, it is possible to provide a piezoelectric thin film resonator with excellent productivity without sacrificing the mechanical strength of the electrode having a hollow structure. Further, a smaller filter can be provided by packaging the piezoelectric thin film resonator of the present embodiment in the filter. Furthermore, a smaller duplexer can be provided by packaging the piezoelectric thin film resonator or the filter of the present embodiment in the duplexer. A smaller communication apparatus can be provided by packaging the filter or the duplexer of the present embodiment in the communication apparatus.

Though the present embodiment refers to a structure characterized in the perimeter shapes of two piezoelectric thin film resonators adjacent to each other, similar effects can be obtained by shaping the perimeters of three piezoelectric thin film resonators adjacent to each other similarly to the structure of the present embodiment.

The piezoelectric thin film resonator disclosed in the present application can be used preferably to a filter or a duplexer packaged in various communication apparatus such as a mobile phone terminal.

(Supplementary Note 1)

A filter comprising a plurality of piezoelectric thin film resonators, the piezoelectric thin film resonators each comprising: a substrate; a lower electrode disposed on the substrate; a piezoelectric film disposed on the substrate and on the lower electrode; and an upper electrode disposed on the piezoelectric film so as to have a part opposing the lower electrode; wherein an electrode region where the upper electrode and the lower electrode overlap each other is shaped to have at least one pair of opposing perimeters that are unparallel to each other; any one of the pair of perimeters opposes an electrode region of an adjacent piezoelectric thin film resonator; and spacing between the perimeter and the opposing perimeter of the electrode region of the adjacent piezoelectric thin film resonator is constant.

(Supplementary Note 2)

The filter according to Supplementary Note 1, wherein adjacent piezoelectric thin film resonators among the plural piezoelectric thin film resonators have opposing electrode regions shaped to be complimentary to each other.

(Supplementary Note 3)

The filter according to Supplementary Note 1 or 2, wherein the perimeter of the electrode region includes a curve.

(Supplementary Note 4)

The filter according to any one of Supplementary Notes 1 to 3, wherein the electrode region is shaped to be substantially linear symmetric.

(Supplementary Note 5)

The filter according to Supplementary Note 1, wherein at least three piezoelectric thin film resonators adjacent to each other are arranged with a substantially constant spacing between the electrode regions thereof.

(Supplementary Note 6)

The filter according to Supplementary Note 1, wherein the substantially linear symmetry axes of the electrode regions and the direction of the current flow are substantially parallel or substantially perpendicular to each other.

(Supplementary Note 7)

A filter comprising a plurality of piezoelectric thin film resonators each provided by laminating: a substrate; a lower electrode disposed on the substrate; a piezoelectric film disposed on the substrate and on the lower electrode; and an upper electrode disposed on the piezoelectric film so as to have a part opposing the lower electrode, wherein the piezoelectric thin film resonator has an electrode region where the upper electrode and the lower electrode overlap each other, the length in the direction parallel to the current flow is shorter than the length in the direction perpendicular to the current flow, and the spacing between the electrode regions of at least two piezoelectric thin film resonators adjacent to each other is substantially constant.

(Supplementary Note 8)

The filter according to any one of Supplementary Notes 1-7, comprising a gap containing the electrode region, below the lower electrode at a site corresponding to the electrode region.

(Supplementary Note 9)

The filter according to any one of Supplementary Notes 1-7, wherein the laminate film comprising the piezoelectric film, the upper electrode and the lower electrode is disposed on the flat main surface of the substrate, and a substantially-dome shaped gap for containing the electrode region is provided below the lower electrode at the site corresponding to the electrode region.

(Supplementary Note 10)

The filter according to any one of Supplementary Notes 1-7, wherein the stress of the laminate film comprising the piezoelectric film, the upper electrode and the lower electrode is compressive stress.

(Supplementary Note 11)

The filter according to any one of Supplementary Notes 1-10, wherein the piezoelectric film is made of a material based on either aluminum nitride or zinc nitride.

(Supplementary Note 12)

The filter according to any one of Supplementary Notes 1-11, wherein at least one of the lower electrode and the upper electrode includes a ruthenium film.

(Supplementary Note 13)

The filter according to any one of Supplementary Notes 1-12, at least a part of the periphery of the piezoelectric film is positioned inside the periphery of the electrode region.

(Supplementary Note 14)

The filter according to any one of Supplementary Notes 1-13, wherein the piezoelectric thin film resonators are connected to each other to be a ladder shape.

(Supplementary Note 15)

A duplexer comprising a transmission filter and a reception filter, the transmission filter and/or reception filter comprise a plurality of piezoelectric thin film resonators, the piezoelectric thin film resonators each comprising: a substrate; a lower electrode disposed on the substrate; a piezoelectric film disposed on the substrate and on the lower electrode; and an upper electrode disposed on the piezoelectric film so as to have a part opposing the lower electrode; wherein an electrode region where the upper electrode and the lower electrode overlap each other is shaped to have at least one pair of opposing perimeters that are unparallel to each other; any one of the pair of perimeters opposes an electrode region of an adjacent piezoelectric thin film resonator; and spacing between the perimeter and the opposing perimeter of the electrode region of the adjacent piezoelectric thin film resonator is constant.

(Supplementary Note 16)

A communication apparatus comprising a transmission filter and a reception filter, the transmission filter and/or reception filter comprise a plurality of piezoelectric thin film resonators, the piezoelectric thin film resonators each comprising: a substrate; a lower electrode disposed on the substrate; a piezoelectric film disposed on the substrate and on the lower electrode; and an upper electrode disposed on the piezoelectric film so as to have a part opposing the lower electrode; wherein an electrode region where the upper electrode and the lower electrode overlap each other is shaped to have at least one pair of opposing perimeters that are unparallel to each other; any one of the pair of perimeters opposes an electrode region of an adjacent piezoelectric thin film resonator; and spacing between the perimeter and the opposing perimeter of the electrode region of the adjacent piezoelectric thin film resonator is constant.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has (have) been described in detail, it should be understood that the various changes, substitutions, and alterations could be made hereto without departing from the spirit and scope of the invention.

The invention claimed is:

1. A filter comprising a plurality of piezoelectric thin film resonators, the piezoelectric thin film resonators each comprising:
a substrate;
a lower electrode disposed on the substrate;
a piezoelectric film disposed on the substrate and on the lower electrode; and
an upper electrode disposed on the piezoelectric film so as to have a part opposing the lower electrode;
wherein an electrode region where the upper electrode and the lower electrode overlap each other is shaped to be cornerless or have all of its corners rounded, and to have at least one pair of opposing perimeters that are unparallel to each other, the electrode region being further shaped to be substantially linear symmetric about a symmetric axis that is perpendicular to a direction of current flowing through the piezoelectric thin film resonator in a plan view;
any one of the pair of perimeters opposes an electrode region of an adjacent piezoelectric thin film resonator;
spacing between the perimeter and the opposing perimeter of the electrode region of the adjacent piezoelectric thin film resonator is constant; and
the symmetric axis of one of the plurality of piezoelectric thin film resonators is substantially parallel to the symmetric axis of at least another one of the plurality of piezoelectric thin film resonators.

2. The filter according to claim 1, wherein adjacent piezoelectric thin film resonators among the plural piezoelectric thin film resonators have opposing electrode regions shaped to be complimentary to each other.

3. The filter according to claim 1, wherein the perimeter of the electrode region includes a curve.

4. The filter according to claim 1, wherein the plurality of piezoelectric thin film resonators are connected in series.

5. The filter according to claim 4, wherein the symmetric axes of all of the plurality of piezoelectric thin film resonators connected in series are substantially parallel to each other.

6. The filter according to claim 1, wherein the plurality of piezoelectric thin film resonators are connected in parallel.

7. A duplexer comprising a transmission filter and a reception filter, the transmission filter and/or reception filter comprise a plurality of piezoelectric thin film resonators, the piezoelectric thin film resonators each comprising:
a substrate;
a lower electrode disposed on the substrate;
a piezoelectric film disposed on the substrate and on the lower electrode; and
an upper electrode disposed on the piezoelectric film so as to have a part opposing the lower electrode;
wherein an electrode region where the upper electrode and the lower electrode overlap each other is shaped to be cornerless or have all of its corners rounded, and to have at least one pair of opposing perimeters that are unparallel to each other, the electrode region being further shaped to be substantially linear symmetric about a symmetric axis that is perpendicular to a direction of current flowing through the piezoelectric thin film resonator in a plan view;
any one of the pair of perimeters opposes an electrode region of an adjacent piezoelectric thin film resonator;

spacing between the perimeter and the opposing perimeter of the electrode region of the adjacent piezoelectric thin film resonator is constant; and the symmetric axis of one of the plurality of piezoelectric thin film resonators is substantially parallel to the symmetric axis of at least another one of the plurality of piezoelectric thin film resonators.

8. A communication apparatus comprising a transmission filter and a reception filter, the transmission filter and/or reception filter comprise a plurality of piezoelectric thin film resonators, the piezoelectric thin film resonators each comprising:
a substrate;
a lower electrode disposed on the substrate;
a piezoelectric film disposed on the substrate and on the lower electrode; and
an upper electrode disposed on the piezoelectric film so as to have a part opposing the lower electrode;
wherein an electrode region where the upper electrode and the lower electrode overlap each other is shaped to be cornerless or have all of its corners rounded, and to have at least one pair of opposing perimeters that are unparallel to each other, the electrode region being further shaped to be substantially linear symmetric about a symmetric axis that is perpendicular to a direction of current flowing through the piezoelectric thin film resonator in a plan view;

any one of the pair of perimeters opposes an electrode region of an adjacent piezoelectric thin film resonator;

spacing between the perimeter and the opposing perimeter of the electrode region of the adjacent piezoelectric thin film resonator is constant; and the symmetric axis of one of the plurality of piezoelectric thin film resonators is substantially parallel to the symmetric axis of at least another one of the plurality of piezoelectric thin film resonators.

* * * * *